(12) United States Patent
Kay et al.

(10) Patent No.: US 7,291,365 B2
(45) Date of Patent: Nov. 6, 2007

(54) LINEAR LASER LIGHT BEAM FOR MAKING OLEDS

(75) Inventors: David B. Kay, Rochester, NY (US); Mitchell S. Burberry, Webster, NY (US); Andrea S. Rivers, Bloomfield, NY (US); Michael L. Boroson, Rochester, NY (US); Lee W. Tutt, Webster, NY (US); Giana M. Phelan, Rochester, NY (US); Daniel D. Haas, Webster, NY (US); Kelvin Nguyen, Rochester, NY (US); Bradley A. Phillips, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 314 days.

(21) Appl. No.: 10/855,719

(22) Filed: May 27, 2004

(65) Prior Publication Data
US 2005/0266172 A1   Dec. 1, 2005

(51) Int. Cl.
*B05D 5/06* (2006.01)
*C23C 14/28* (2006.01)
*C23C 14/32* (2006.01)
*C23C 14/12* (2006.01)

(52) U.S. Cl. ............ 427/596; 427/561; 427/64; 427/68; 427/74; 427/75

(58) Field of Classification Search ............ None
See application file for complete search history.

(56) References Cited

U.S. PATENT DOCUMENTS

| | | | |
|---|---|---|---|
| 5,580,410 A | 12/1996 | Johnston | |
| 5,688,551 A | 11/1997 | Littman et al. | |
| 5,742,129 A | 4/1998 | Nagayama et al. | |
| 5,851,709 A * | 12/1998 | Grande et al. | 430/7 |
| 5,904,961 A * | 5/1999 | Tang et al. | 427/561 |
| 6,114,088 A | 9/2000 | Wolk et al. | |
| 6,140,000 A | 10/2000 | Yamashita | |
| 6,214,520 B1 | 4/2001 | Wolk et al. | |
| 6,218,068 B1 | 4/2001 | Tanaka et al. | |
| 6,221,553 B1 | 4/2001 | Wolk et al. | |
| 6,582,875 B1 * | 6/2003 | Kay et al. | 430/200 |
| 6,997,923 B2 * | 2/2006 | Anderson et al. | 606/9 |
| 7,075,640 B2 * | 7/2006 | Baer et al. | 356/244 |
| 2006/0148070 A1 * | 7/2006 | Baer et al. | 435/288.7 |

FOREIGN PATENT DOCUMENTS

EP   1 333 510   8/2003

* cited by examiner

*Primary Examiner*—Marianne Padgett
(74) *Attorney, Agent, or Firm*—Raymond L. Owens

(57) ABSTRACT

A method of transferring organic material from a donor element to a substrate includes providing a radiation source; and selecting the power of the radiation applied to the donor element by the radiation source to cause the transfer of organic material to the substrate wherein the time that one or more positions of the donor element receives radiation is greater than 1 millisecond.

10 Claims, 9 Drawing Sheets

LINEAR LASER LIGHT BEAM FOR MAKING OLEDS

CROSS-REFERENCE TO RELATED APPLICATIONS

Reference is made to commonly assigned U.S. Patent Application commonly assigned U.S. patent application Ser. No. 10/854,918 filed May 27, 2004 by Kelvin Nguyen et al., entitled "Depositing an Organic Layer for Use in OLEDS", and commonly assigned U.S. patent application Ser. No. 10/855,679 filed May 27, 2004 by Kelvin Nguyen et al., entitled "Plural Metallic Layers In OLED Donor", the disclosures of which are incorporated herein by reference.

FIELD OF THE INVENTION

The present invention relates to depositing organic material onto substrates for use in making OLED devices.

BACKGROUND OF THE INVENTION

In color or full-color organic electroluminescent (EL) displays, there is an array of colored pixels such as red, green, and blue color pixels (commonly referred to as RGB pixels). Precision patterning of the color-producing organic EL media is required to produce the RGB pixels. The basic organic EL device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the light-emitting layer of the organic EL medium. Other organic layers present in the organic EL medium can provide electronic transport functions primarily, such as the hole-transporting layer or the electron-transporting layer. In forming the RGB pixels in a full-color organic EL display panel, it is necessary to devise a method to precisely pattern the light-emitting layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. There are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow-mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision for accurately forming EL devices.

A method for patterning high-resolution organic EL displays has been disclosed in U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow-mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman in U.S. Pat. No. 5,688,551, and in a series of patents by Wolk et al. (U.S. Pat. Nos. 6,114,088; 6,140,009; 6,214,520; and 6,221,553). The latter patents teach a method that can transfer, by a change in adhesion, the light-emitting layer of an EL device from a donor sheet to a substrate by heating selected portions of the donor with a scanning laser light spot. While this is a useful technique, there are serious difficulties in applying it on a large-scale manufacturing of EL devices. To make an EL device that includes thousands—or even millions—of pixels in three colors in a reasonable amount of time (a few minutes) would require a laser spot that moves very fast in two dimensions. The need for rapidly moving machinery increases the demands in terms of dynamic structural stability. A failure to control the alignment between the laser source and the substrate due to machine vibrations will result in a decrease in display quality. A further disadvantage is that the rapid movement of the laser beam necessitates a very short dwell time on each spot to be transferred, which further necessitates a very high-powered laser.

Another method for patterning high-resolution organic EL displays has been disclosed in U.S. Pat. No. 6,582,875 by Kay et al. and uses a multichannel laser thermal printhead with a donor and a receiver. The printhead is first aligned to the receiver, and the printhead then scans and exposes the donor in the regions desired for donor transfer to the receiver. Many channels allow an increase in dwell time at each donor pixel site, while maintaining productivity. However, devices made in a scanning mode often do not perform as well as standard evaporated devices.

SUMMARY OF THE INVENTION

It is therefore an object of the present invention to provide a method for manufacturing an OLED device by a thermal transfer method with performance equal to, or nearly equal to, the standard technique of evaporating light-emitting material through an aligned shadow mask. It is a further object to accomplish this without a large increase in manufacturing time.

This object is achieved by a method of transferring organic material from a donor element to a substrate comprising:

(a) providing a radiation source; and (b) selecting the power of the radiation applied to the donor element by the radiation source to cause the transfer of organic material to the substrate wherein the time that one or more positions of the donor element receives radiation is greater than 1 millisecond.

An advantage of this method is that electroluminescent panels can be produced with high quality without the use of shadow masks and the problems inherent in their use. The overall donor transfer time is in the regime where good lifetime performance is achieved while not increasing significantly the necessary manufacturing time. A further advantage of this method is that the substantially uniform intensity profile of the linear laser light beam in the linear direction maintains good uniformity of the deposited layer. A further advantage is that the method is scalable to any size EL panels without the need to wait for a different-size shadow mask to be fabricated. It is a further advantage of this method that it requires relative movement in a single direction only. As the need for rapid accelerations is reduced, the system can be built with less expensive components. Reducing the need for dynamic structural integrity will enable a lower cost, and smaller design, and the image data rates are lower

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. However, the use of additional colors to extend the color gamut of the device is possible. The term "pixel" is employed in its art-recognized usage to designate an area of a display panel that can be stimulated to emit light independently of other areas. However, it is recognized that in full-color systems, several pixels of different colors will be used together to generate a broad range of colors, and a viewer may term such a group a single pixel.

Figure 1A:
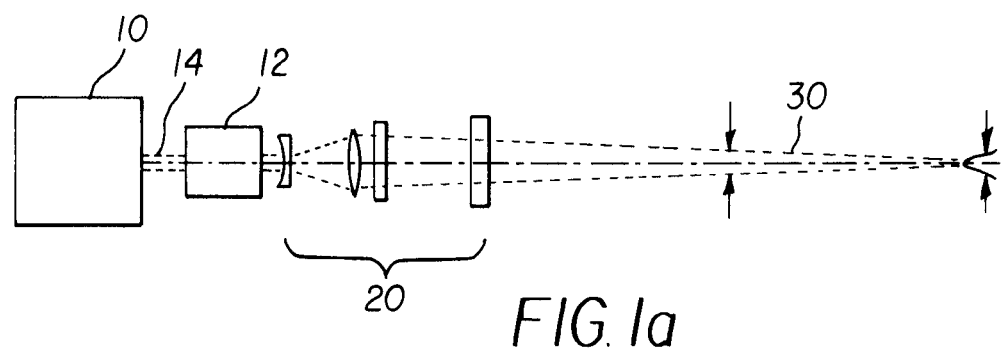
FIG. 1a shows a schematic side view of a laser source and associated optics to form a linear laser light beam.
Figure 1B:
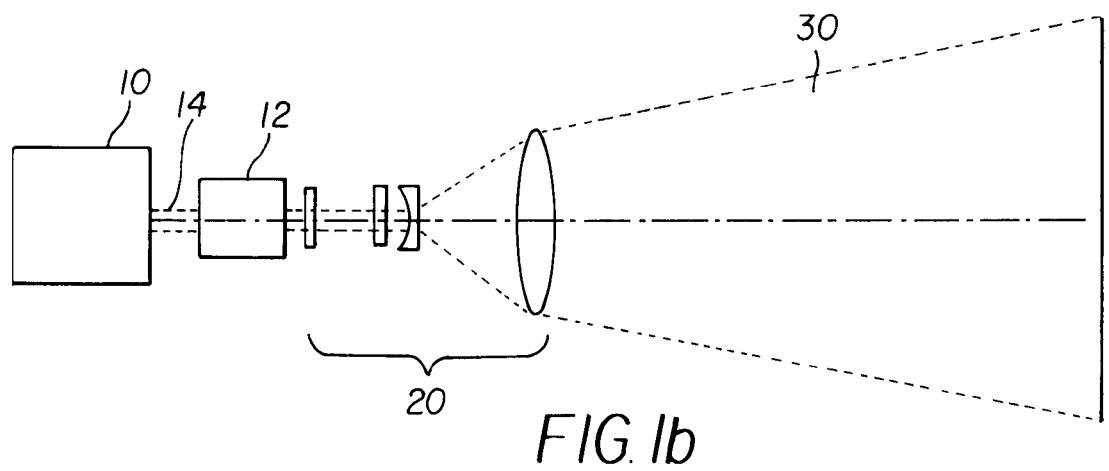
FIG. 1b shows a schematic top view of the above laser source and associated optics to form a linear laser light beam.
Figure 1C:
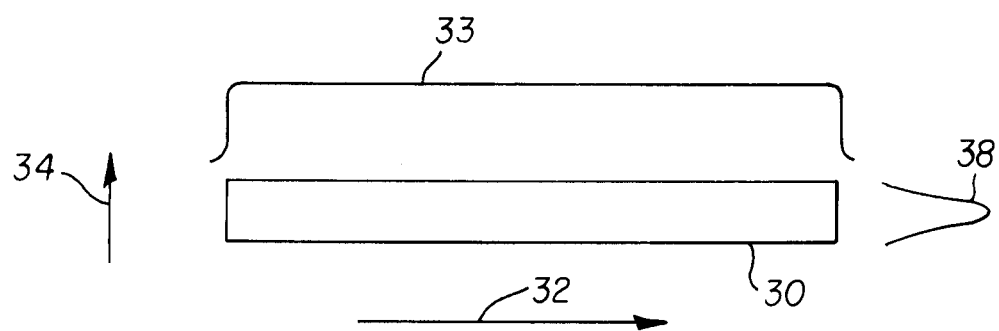
FIG. 1c shows a cross-sectional view of a substantially uniform linear laser light beam and its intensity profile in two dimensions.

Turning now to FIGS. 1a and 1b, there is shown an optical system that can produce a substantially uniform linear laser light beam as required by this invention to expose a donor along a narrow stripe region. FIG. 1a shows a side view and FIG. 1b shows a top view. A radiation source is provided, e.g. laser radiation source 10, which produces laser beam 14. Laser beam 14 passes through beam shaper 12 that modifies the usual Gaussian beam irradiance to be reasonably uniform in one direction. Illumination optics 20 is a series of lenses that shape the light into linear laser light beam 30. Linear laser light beam 30 is wide in a first direction (as shown by FIG. 1b), and narrow in a second direction (as shown by FIG. 1a). Although laser radiation source 10, illumination optics 20, and the path of linear laser light beam 30 are shown in a linear fashion, they can be folded by internal reflection as known in the art to produce an apparatus that is more compact than the desired optical path. Linear laser light beam 30 is a substantially uniform linear laser light beam, as shown in FIG. 1c, which is a cross-sectional view of the above linear laser light beam 30. Linear laser light beam 30 has a substantially uniform intensity profile 33 in a first direction 32, that is, intensity profile 33 does not vary by more than preferably ±10%. Linear laser light beam 30 has a substantially Gaussian-like intensity profile 38 in a second direction 34 perpendicular to first direction 32, that is, the light intensity is distributed in a manner that closely resembles a statistically normal distribution. Alternately, a beam shaper can be used that gives a reasonably uniform beam irradiance profile in both dimensions, but higher numerical aperture optics would be required in the narrow beam dimension to give the required beam width at the donor.

Figure 2:
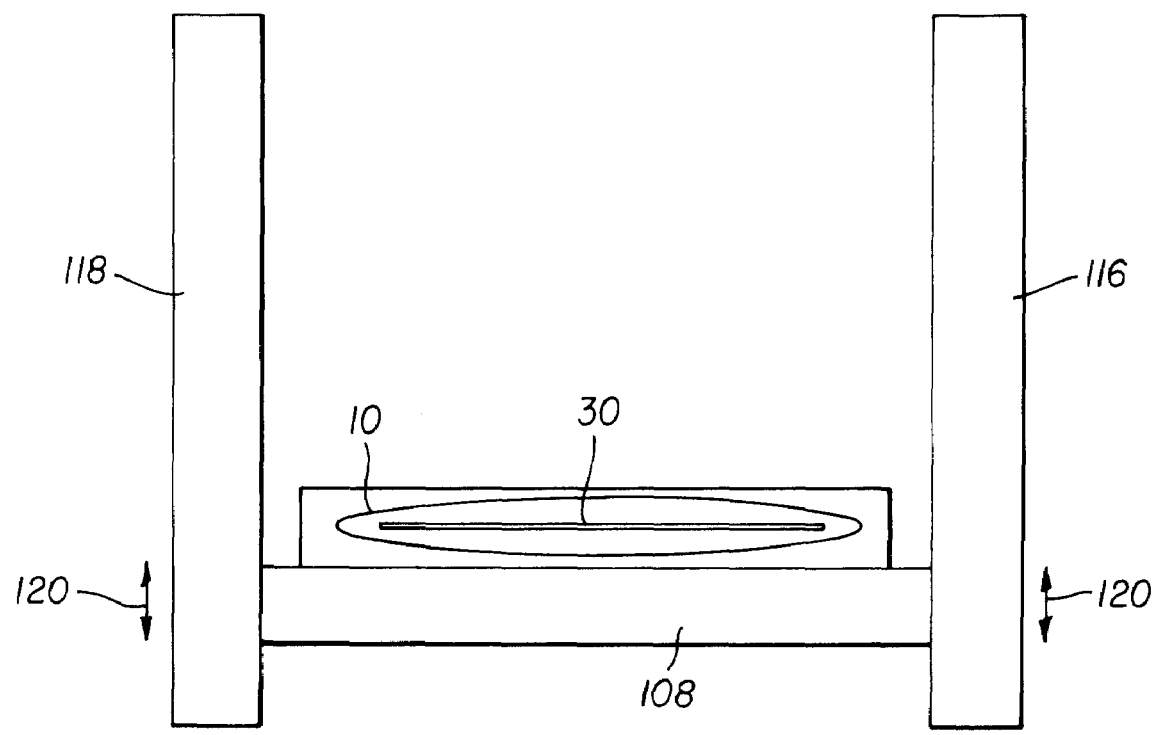
FIG. 2 is a top-view diagram showing a first embodiment of an apparatus of a laser source and micropositioning devices in accordance with this invention.

Turning now to FIG. 2, there is shown one embodiment of an apparatus for moving linear laser light beam 30 in accordance with this invention. This apparatus serves to provide relative movement between linear laser light beam 30 and the donor element by moving laser radiation source 10 while the substrate/donor element combination is held stationary. It will be understood that other methods of providing relative movement are also possible, e.g. moving the substrate/donor element while holding laser radiation source 10 stationary, or holding both the substrate/donor element and laser radiation source 10 stationary while providing motion of linear laser light beam 30 by other means, e.g. mirrors. Laser radiation source 10 is mounted on carriage 108. Carriage 108 is mounted to micropositioning device 116 and micropositioning device 118. Micropositioning devices 116 and 118 are capable of moving and locating laser radiation source 10 in direction 120 with a resolution on the order of micrometers. Micropositioning devices 116 and 118 are arranged in a manner orthogonal to carriage 108, and are thus capable of moving the combination of carriage 108 and laser source 10 in direction 120 and of providing a small angular adjustment of linear laser light beam 30 so as to allow alignment to the orientation of the substrate. Alignment can be done by a method such as taught by Rivers and Tang in U.S. Pat. No. 6,682,863.

Alternately, after micropositioning devices 116 and 118 are adjusted so the linear laser light beam 30 is aligned to a substrate row of pixels, the carriage 108 is moved at a fixed velocity by micropositioning devices 116 and 118, and a mirror or other deflecting optic scans the linear laser light beam in the opposite direction to maintain it focused on a row of pixels until the laser is turned off. The mirror or deflector scan is returned for positioning the linear laser light be on the next row of pixels when the laser is turned to expose the new row, and so on.

Figure 3:
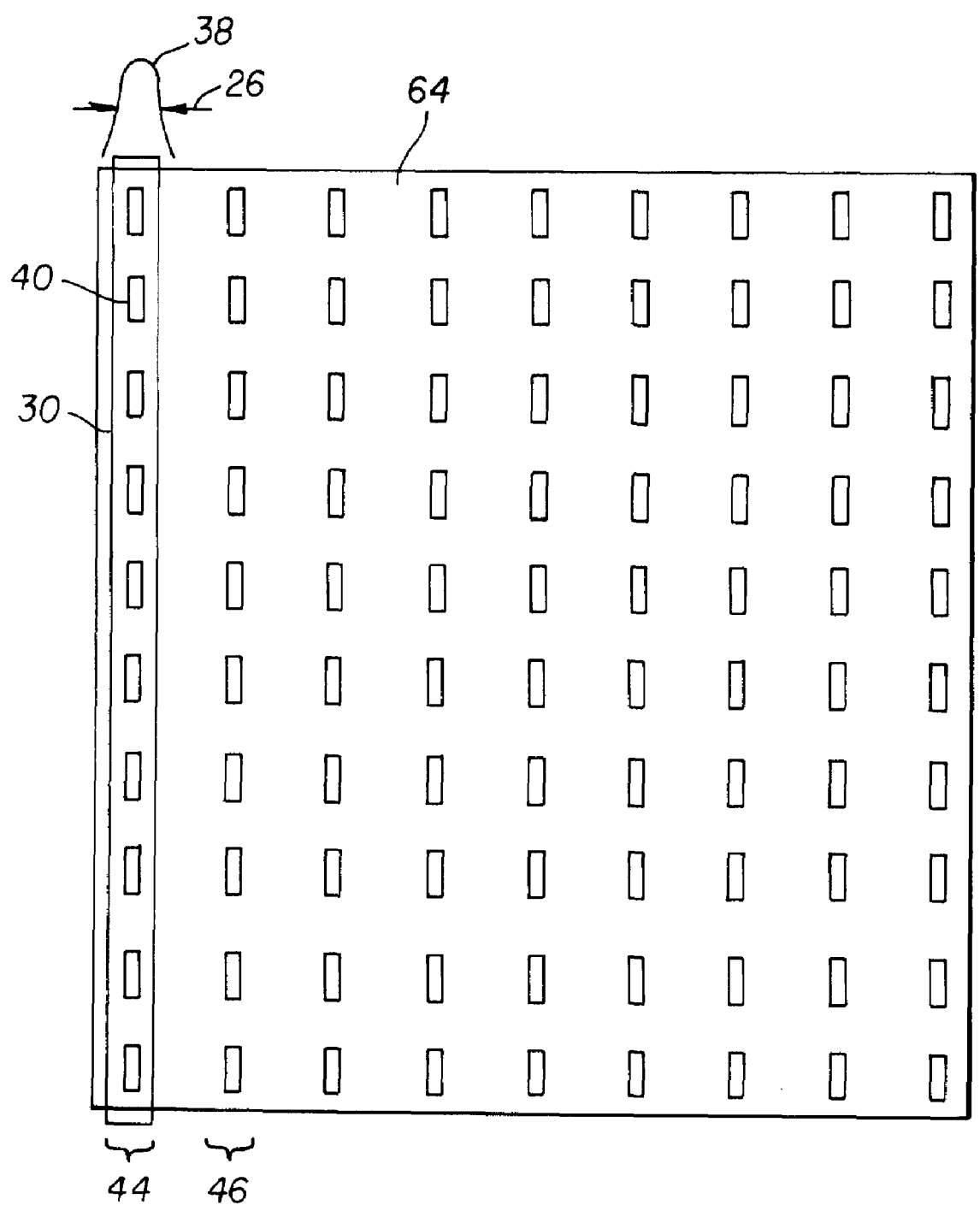
FIG. 3 is a schematic view of one embodiment of the irradiation of a substrate/donor element combination by a linear laser light beam in accordance with this invention.

Turning now to FIG. 3, there is shown a linear laser light beam 30 that extends across all of a first plurality of pixels in a row on an OLED substrate 64. For clarity of illustration, a donor element is not shown, but it will be understood that linear laser light beam 30 in fact illuminates such donor and not substrate 64. Pixels 40 are pixels of a single color, e.g. red, organized in rows in the final OLED device. The substrate 64 can also include pixels of other colors, which are not shown for clarity. For example, between first plurality of pixels 44 and second plurality of pixels 46, there can be a row of green-light-emitting pixels and a row of blue-light-emitting pixels. The width of linear laser light beam 30 is defined as the portion of the Gaussian distribution that exceeds 50% of the maximum intensity, which is shown as full width at half maximum 26. Linear laser light beam 30 has a length and width such that it can irradiate all of first plurality of pixels 44.

Linear laser light beam 30 can irradiate the portion of the donor element against first plurality of pixels 44, which will cause the transfer of organic material from the donor element to the first plurality of pixels 44 on the substrate. After linear laser light beam 30 transfers organic material to all pixels of first plurality of pixels 44, linear laser light beam 30 can be turned off, moved to a new position over second plurality of pixels 46, and then turned on to cause the transfer of organic material to the substrate at second plurality of pixels 46. This process can be repeated to transfer organic material to all pixels of a color on a substrate.

It has been found that a transfer of current organic materials from a donor element to a substrate over a longer time and at a lower power than has been used for radiation thermal transfer in the prior art (e.g. Kay et al., U.S. Pat. No. 6,582,875) can provide OLED devices with a significantly longer lifetime. However, decreasing the power and increasing the exposure time of prior art methods would result in an unacceptably long manufacturing time for an OLED device. The present method overcomes this problem by irradiating many more pixels at a lower power. The power of laser beam 14 provided by laser radiation source 10 (as in FIG. 1) can be adjusted so as to select the power of the radiation applied to the donor element and cause the transfer of organic material to the substrate over a desired time, wherein any given position of the donor element receives radiation for greater than 1 millisecond.

The power per area of the radiation applied to the donor element can also be adjusted by modifying the size of the beam. However, this can be dictated by the size of the substrate and the space between rows of pixels.

Figure 4:
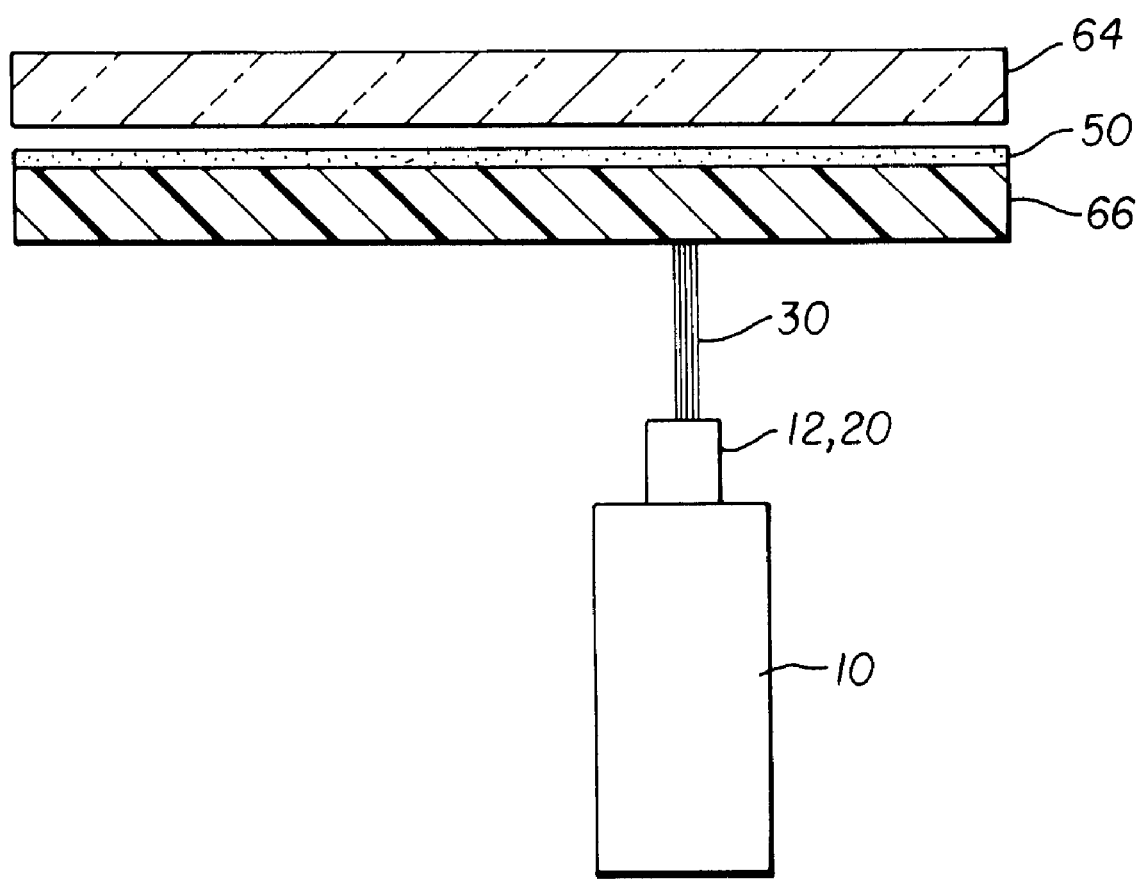
FIG. 4 shows a cross-sectional view of a linear laser light beam irradiating a secured substrate/donor element combination in accordance with this invention.

FIG. 4 shows a cross-sectional view of laser radiation source 10 irradiating a secured substrate/donor element combination with a modulated multichannel linear laser light beam in accordance with this invention. Micropositioning equipment is not shown for clarity. Donor element 50 is secured relative to substrate 64, that is, donor element 50 is placed in contact (not shown) with substrate 64, or is held with a controlled separation (shown) from substrate 64, and is held in position by e.g. pressurizing means 66 as taught by Phillips, et al. in U.S. patent application Publication 2003/014870. Substantially uniform linear laser light beam 30 illuminates donor element 50 to cause the transfer of organic material to the appropriate portions of substrate 64, as described above. The transfer of organic material can be done under reduced pressure (e.g. a vacuum) or under atmospheric pressure (e.g. an inert atmosphere), as taught by Boroson et al. in U.S. Pat. Nos. 6,555,284 and 6,566,032.

Substrate 64 can be an organic solid, an inorganic solid, or a combination of organic and inorganic solids that provides a surface for receiving the light-emitting material from a donor. Substrate 64 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof Substrate 64 can be a homogeneous mixture of materials, a composite of materials, or multiple layers of materials. Substrate 64 can be an OLED substrate, that is a substrate commonly used for preparing OLED devices, e.g. active-matrix low-temperature polysilicon TFT substrate. The substrate 64 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials.

The structure of donor element 50 has been described before, e.g. by Boroson et al. in U.S. Pat. No. 6,555,284. Donor element 50 can include as a transferable layer an organic material for forming a useful layer in an OLED device, e.g. a hole-transporting material, a light-emitting material, an electron-transporting material, or some combination.

Hole-transporting materials useful in an OLED device are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

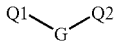
A wherein:
Q₁ and Q₂ are independently selected aromatic tertiary amine moieties; and
G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

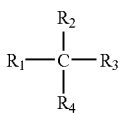
B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

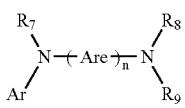
D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1":4'",1'"-quaterphenyl
Bis(4-dimethylamino-2-methylphenyl)phenylmethane
1,4-bis[2-[4-[N,N-di(p-tolyl)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
2,6-Bis[N,N-di(2-naphthyl)amino]fluorene
4,4',4"-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. A light-emitting layer can include a single material, but more commonly includes a host doped with a guest compound or dopant where light emission comes primarily from the dopant. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

The host and emitting materials can be small non-polymeric molecules or polymeric materials including polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the bandgap of the dopant is smaller than that of the host material. For phosphorescent emitters (including materials that emit from a triplet excited state, i.e., so-called "triplet emitters") it is also important that the triplet energy level of the host be high enough to enable energy transfer from host to emitting material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

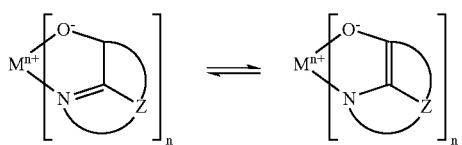

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo {f}-8-quinolinolato]zinc (II)
CO-4: Bis(2-methyl-8-quinolinolato)aluminum(II)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (II)]; and
CO-9: Zirconium oxine [alias, tetra(8-quinolinolato)zirconium(IV)].

The host material in one or more of the light-emitting layers of this invention can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

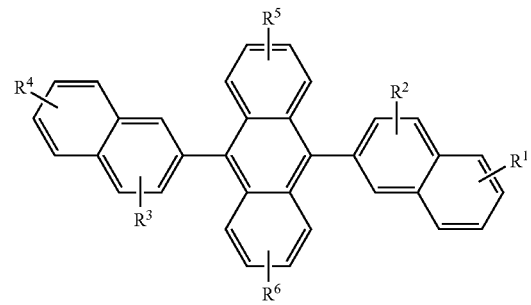

F wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

The monoanthracene derivative of Formula (I) is also a useful host material capable of supporting electroluminescence, and are particularly suitable for light emission of wavelengths longer than 400 nm, e.g., blue, green, yellow, orange or red. Anthracene derivatives of Formula (I) is described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

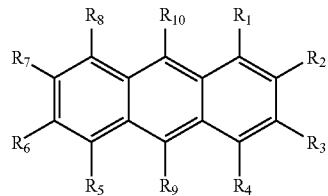

(I)

wherein:

$R_1$-$R_8$; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-( 2-naphthyl)-10-(4-biphenyl)anthracene.

Another useful class of anthracene derivatives is represented by general formula (II):

A1-L-A2   (II)

wherein A1 and A2 each represent a substituted or unsubstituted monophenylanthryl group or a substituted or unsubstituted diphenylanthryl group and can be the same with or different from each other and L represents a single bond or a divalent linking group.

Another useful class of anthracene derivatives is represented by general formula (III):

A3-An-A4   (III)

wherein An represents a substituted or unsubstituted divalent anthracene residue group, A3 and A4 each represent a substituted or unsubstituted monovalent condensed aromatic ring group or a substituted or unsubstituted non-condensed ring aryl group having 6 or more carbon atoms and can be the same with or different from each other. Specific examples of useful anthracene materials for use in a light-emitting layer include:

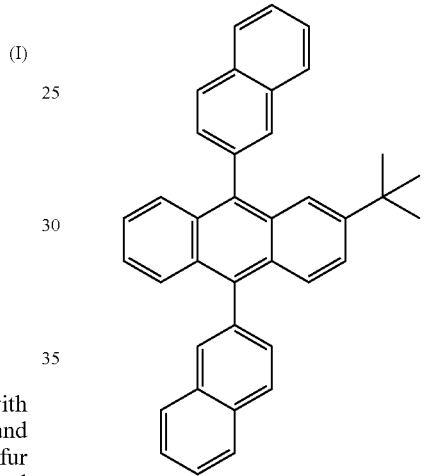

AH1

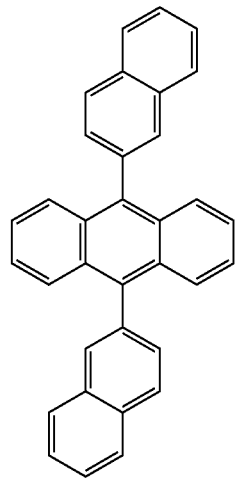

AH2

-continued

AH3
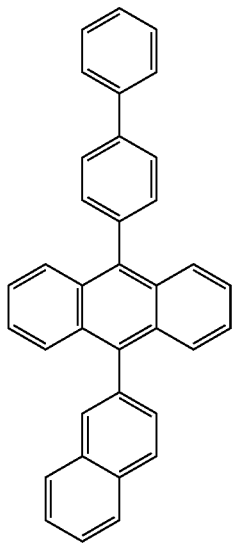

AH4
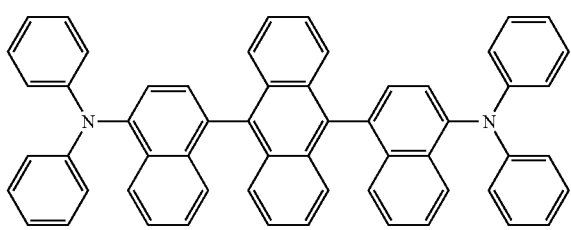

AH5
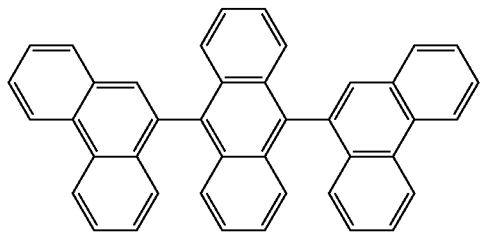

AH6
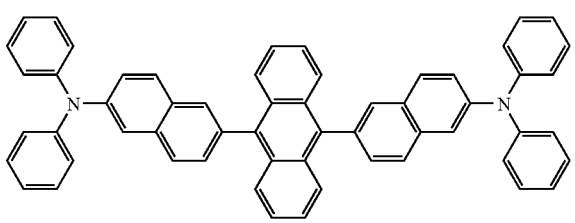

AH7
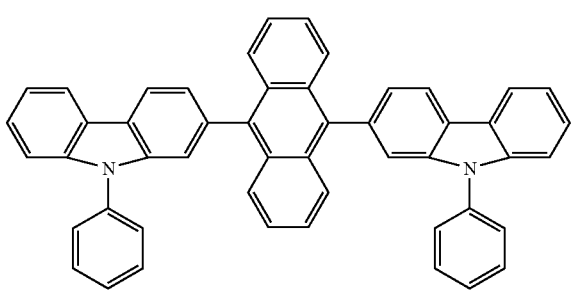

AH8
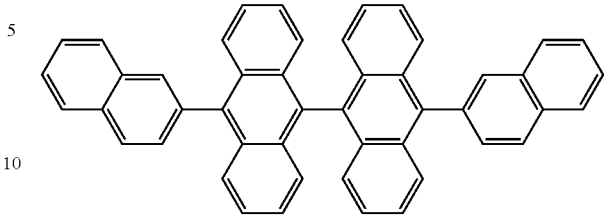

AH9
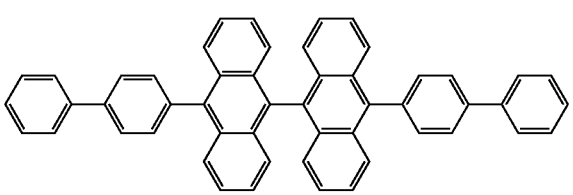

Benzazole derivatives (Formula G) constitute another class of useful host materials capable of supporting electroluminescence, and are particularly suitable for light emission of wavelengths longer than 400 nm, e.g., blue, green, yellow, orange or red.

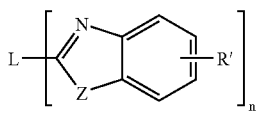

G where:
n is an integer of 3 to 8;
Z is O, NR or S;
R' is hydrogen; alkyl of from 1 to 24 carbon atoms, for example, propyl, t-butyl, heptyl, and the like; aryl or heteroatom-substituted aryl of from 5 to 20 carbon atoms for example phenyl, naphthyl, furyl, thienyl, pyridyl, quinolinyl and other heterocyclic systems; or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Certain of the hole-transporting materials described above, e.g. 4,4'-bis[N-(1-naphthyl)-N-phenylamino]biphenyl and 4,4'-bis[N-(2-naphthyl)-N-phenylamino]biphenyl, can also be useful hosts for one or more of the light-emitting layers of this invention.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2; 01/39234 A2; 01/93642 A1; 02/074015 A2; 02/15645 A1, and U.S. Patent Application Publication 2002/0117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)biphenyl, m-(N,N'-dicarbazole)benzene, and poly(N-vinylcarbazole), including their derivatives.

Desirable host materials are capable of forming a continuous film. The light-emitting layer can contain more than one host material in order to improve the device's film morphology, electrical properties, light emission efficiency, and lifetime. The light-emitting layer can contain a first host material that has good hole-transporting properties, and a second host material that has good electron-transporting properties.

Desirable fluorescent dopants for OLED displays commonly include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds. Illustrative examples of dopants include, but are not limited to, the following:

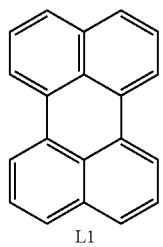

L1

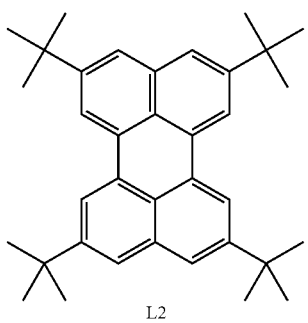

L2

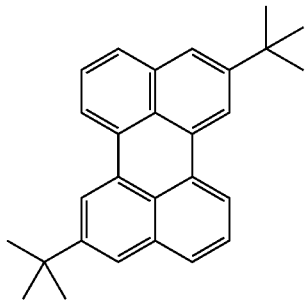

L3

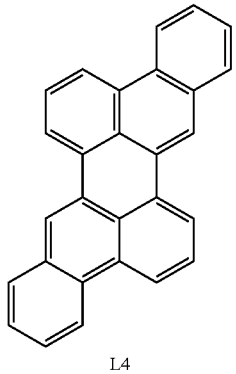

L4

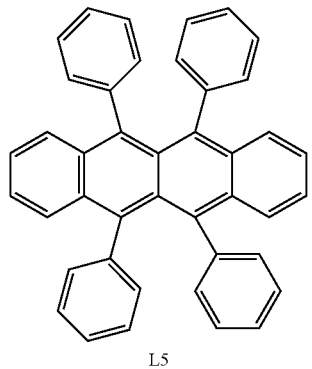

L5

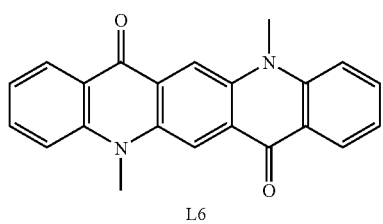

L6

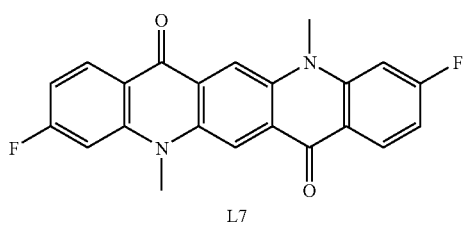

L7

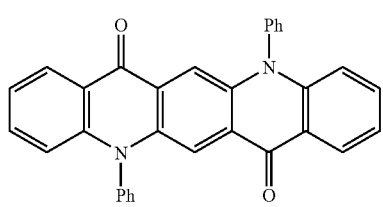

L8

-continued

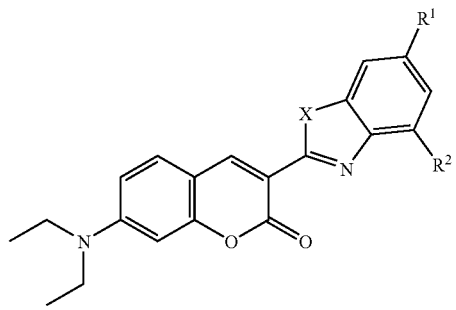

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

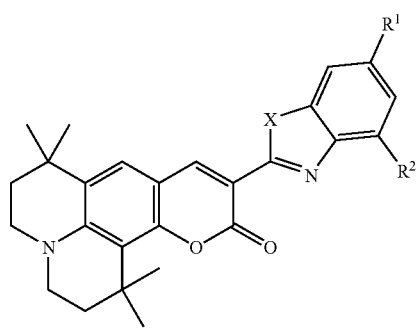

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

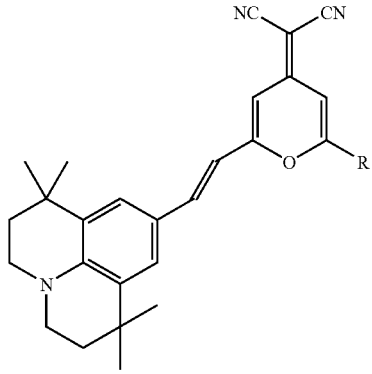

| | R |
|---|---|
| L37 | phenyl |
| L38 | methyl |
| L39 | t-butyl |
| L40 | mesityl |

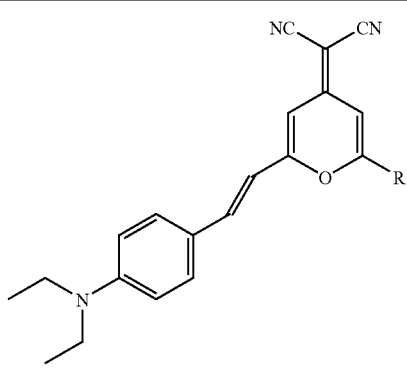

| | R |
|---|---|
| L41 | phenyl |
| L42 | methyl |
| L43 | t-butyl |
| L44 | mesityl |

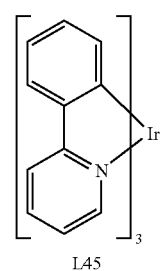

L45

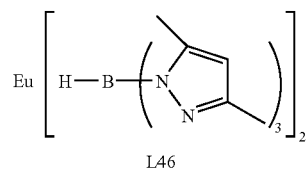

L46

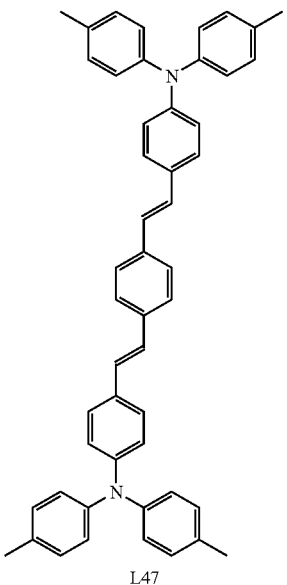
L47
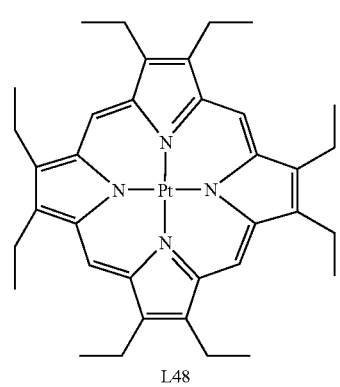
L48
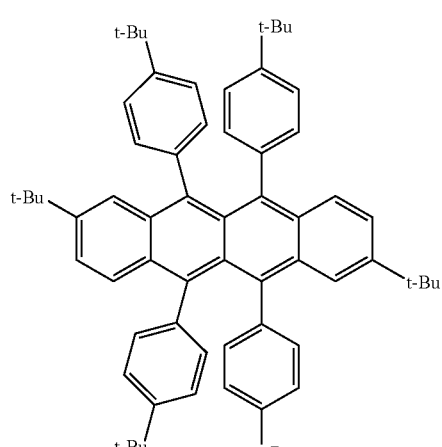
L49
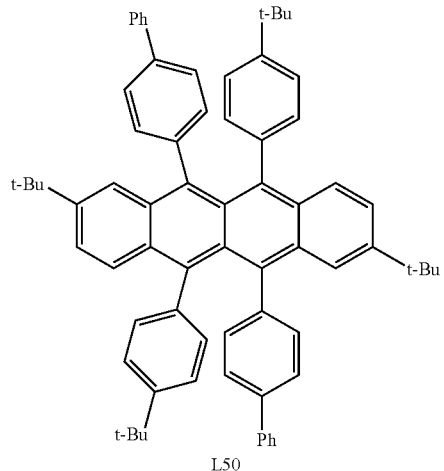
L50
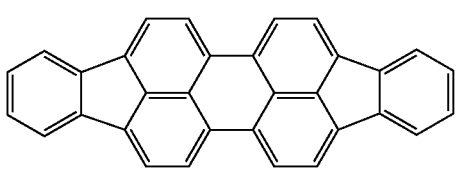
L51
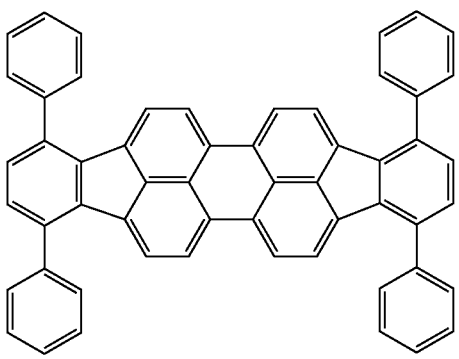
L52
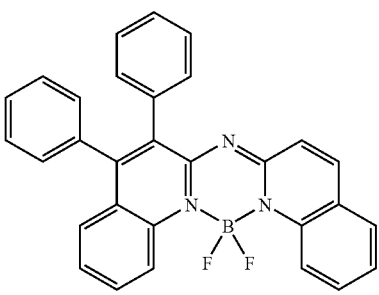
L53

-continued

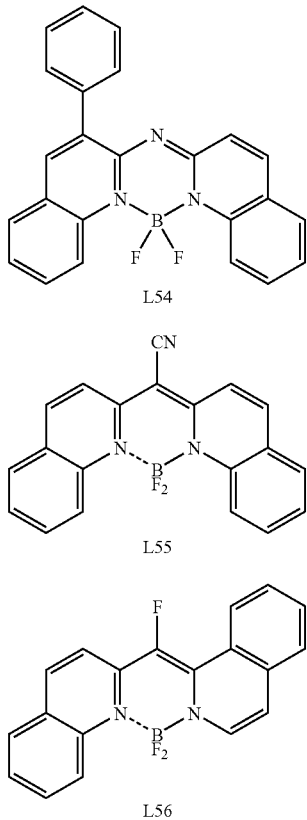

L54

L55

L56

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Examples of useful phosphorescent materials that can be used in light-emitting layers of this invention include, but are not limited to, those described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003/073387A, JP 2003/073388A, US 2003/0141809 A1, US 2003/0040627 A1, JP 2003/059667A, JP 2003/073665A, and US 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)Iridium(III) and bis(2-phenylpyridinato-N,$C^{2'}$)Iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N, $C^{3'}$)Iridium(III)(acetylacetonate) and tris(1-phenylisoquinolinato-N,C) Iridium(III). A blue-emitting example is bis(2-(4,6-diflourophenyl)-pyridinato-N,$C^{2'}$)Iridium(III) (picolinate).

Red electrophosphorescence has been reported, using bis(2-(2'-benzo[4,5-a]thienyl)pyridinato-N, $C^3$) iridium (acetylacetonate) [$Btp_2Ir(acac)$] as the phosphorescent material (Adachi, C., Lamansky, S., Baldo, M. A., Kwong, R. C., Thompson, M. E., and Forrest, S. R., *App. Phys. Lett.*, 78, 1622-1624 (2001)).

Still other examples of useful phosphorescent materials include coordination complexes of the trivalent lanthanides such as $Tb^{3+}$ and $Eu^{3+}$ (J. Kido et al, *Appl. Phys. Lett.*, 65, 2124 (1994))

Preferred electron-transporting materials are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials. Related materials, denoted collectively as BAlq, can also be used as electron transporting materials. Bryan et al., in U.S. Pat. No. 5,141,671, discuss such materials. The BAlq compounds are mixed-ligand aluminum chelates, specifically bis($R_s$-8-quinolinolato)(phenolato)aluminum(III) chelates, where $R_s$ is a ring substituent of the 8-quinolinolato ring nucleus. These compounds are represented by the formula $(R_sQ)_2AlOL$, where Q represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms. These materials also make good hole- or exciton-blocking layers for use with triplet emitting materials, as is known in the art.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

Figure 5:
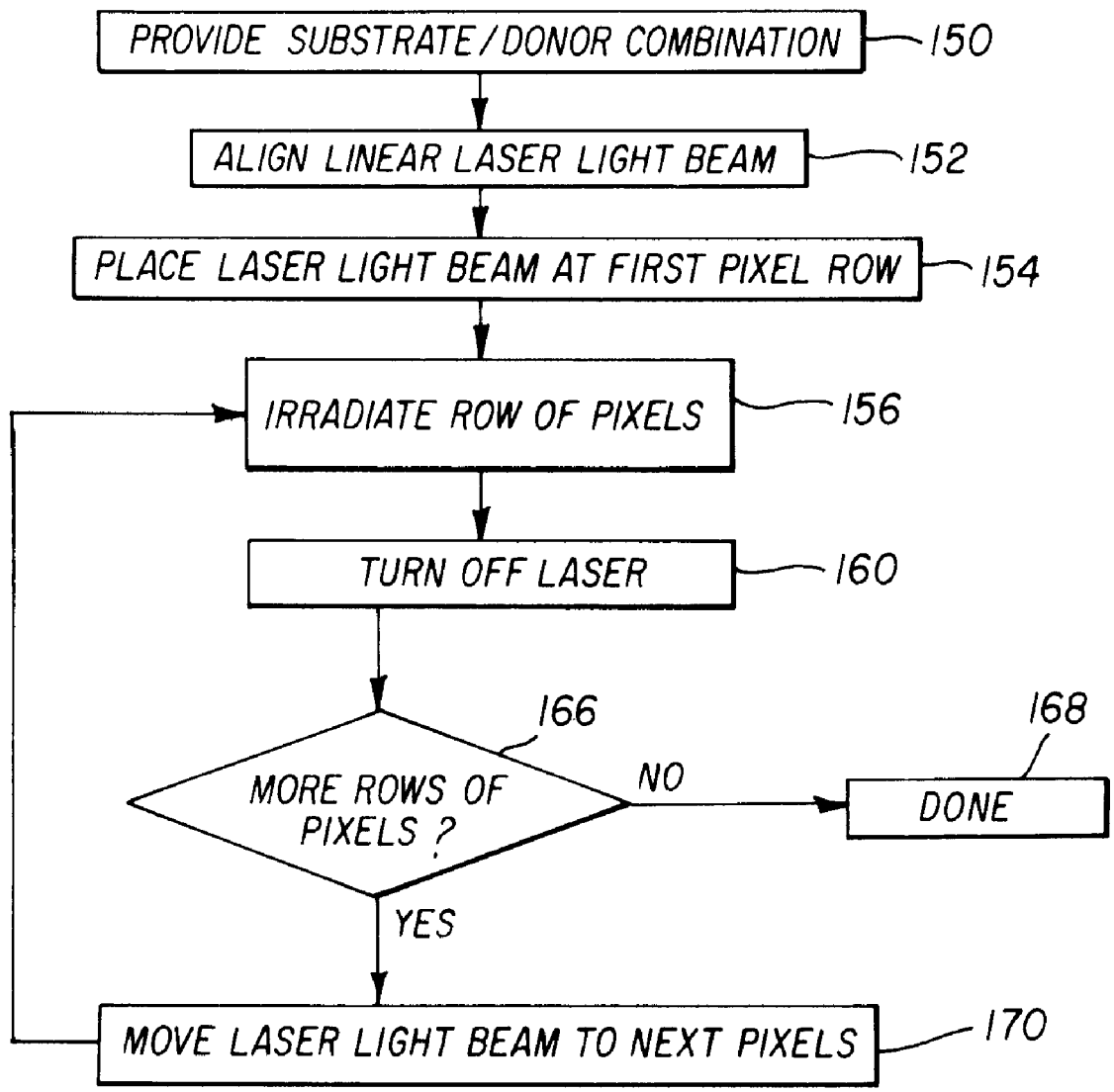
FIG. 5 is a block diagram showing one embodiment of a method of transferring organic material to an OLED substrate in accordance with this invention.

Turning now to FIG. 5, and referring also to FIG. 3, there is shown one embodiment of the steps of a method of transferring organic material from a donor element to a substrate in accordance with this invention. Initially, a secured substrate/donor element combination is provided (Step 150). Linear laser light beam 30 is then aligned as described by Rivers and Tang with pixels 40 on the substrate (Step 152). The laser position can be modified, or the substrate position can be modified, or a combination of these techniques can be used. Linear laser light beam 30 is placed on a first plurality of pixels 44 (Step 154), and then turned on to irradiate first plurality of pixels 44 for a period of time greater than 1 millisecond (Step 156) to cause the transfer of organic material from the donor element to the substrate. The exact time of irradiation will depend on the power of the laser, the desired rate of transfer of organic material, and the total area of first plurality of pixels 44 to which organic material is to be transferred. After linear laser light beam 30 transfers organic material to all of first plurality of pixels 44, linear laser light beam 30 is turned off (Step 160). If further rows of pixels are to be treated (Step 166), linear laser light beam 30 is moved (Step 170) to the next row of pixels to be irradiated (e.g. second plurality of pixels 46), and is turned on to cause the transfer of organic material to the substrate. Steps 156 and 160 are repeated as necessary. If there are no more pixels of the specific color to be treated (Step 166), the process ends (Step 168).

Figure 6:
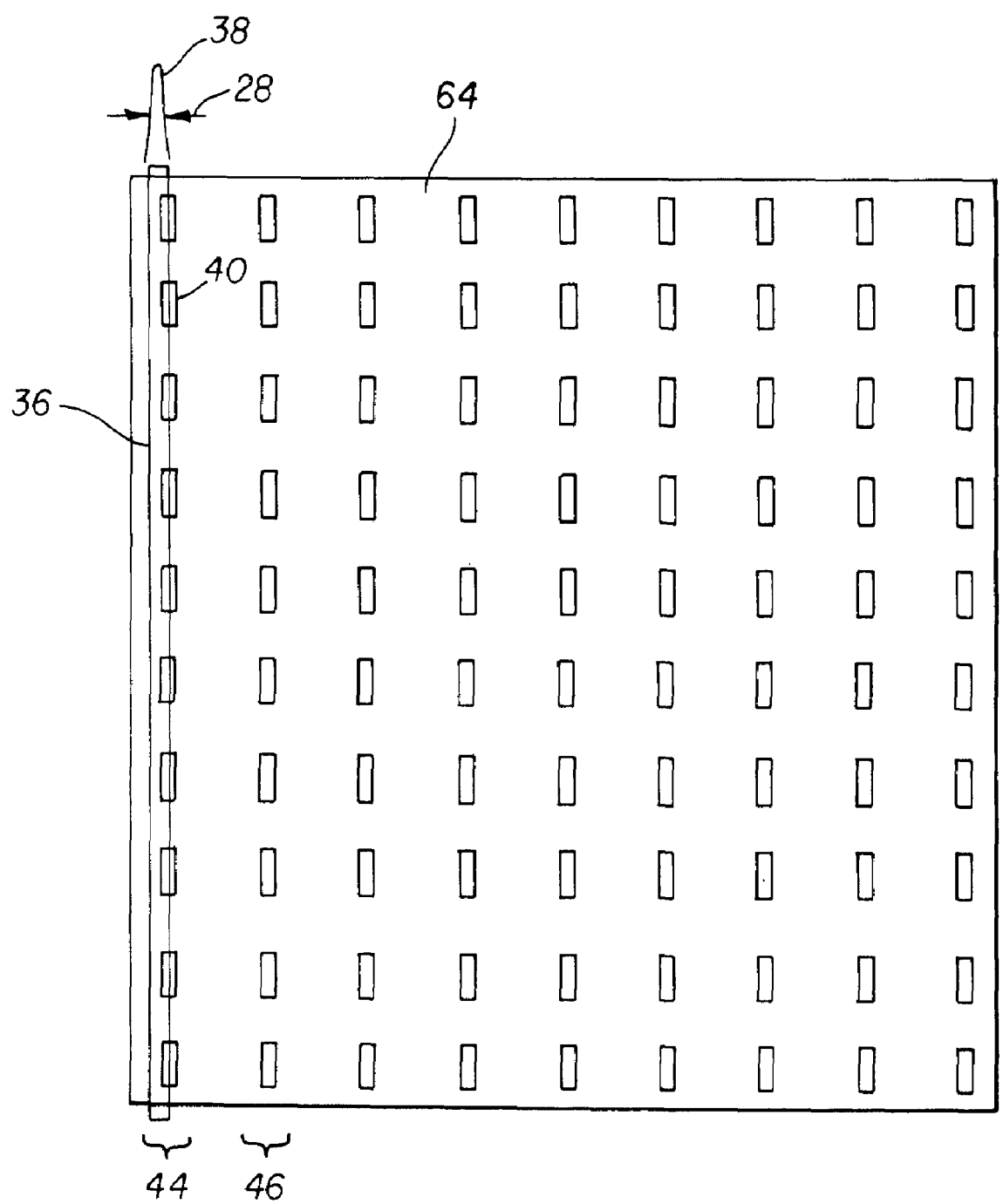
FIG. 6 is a schematic view of another embodiment of the irradiation of a substrate/donor element combination by a linear laser light beam in accordance with this invention.

Turning now to FIG. 6, there is shown a linear laser light beam 36 that is narrower than pixels 40 as shown by a narrower full width at half maximum 28, and that extends across a first portion of first plurality of pixels 44 on substrate 64. Linear laser light beam 36 will cause the transfer of organic material from the donor element to the first portion of first plurality of pixels 44. After organic material is transferred to the first portion of first plurality of pixels 44, linear laser light beam 36 can be turned off, moved to a new position over a new portion of first plurality of pixels 44, and then turned on to cause the transfer of organic material to the substrate at the second portion of first plurality of pixels 44. This can be repeated as many times as necessary to transfer organic material to the entirety of first plurality of pixels 44. After linear laser light beam 36 transfers organic material to all pixels of first plurality of pixels 44, linear laser light beam 36 can be turned off, moved to a new position over second plurality of pixels 46, and then turned on to cause the transfer of organic material to the substrate at a first portion of second plurality of pixels 46. This process can be repeated to transfer organic material to all portions of all pixels of a given color on a substrate.

Figure 7:
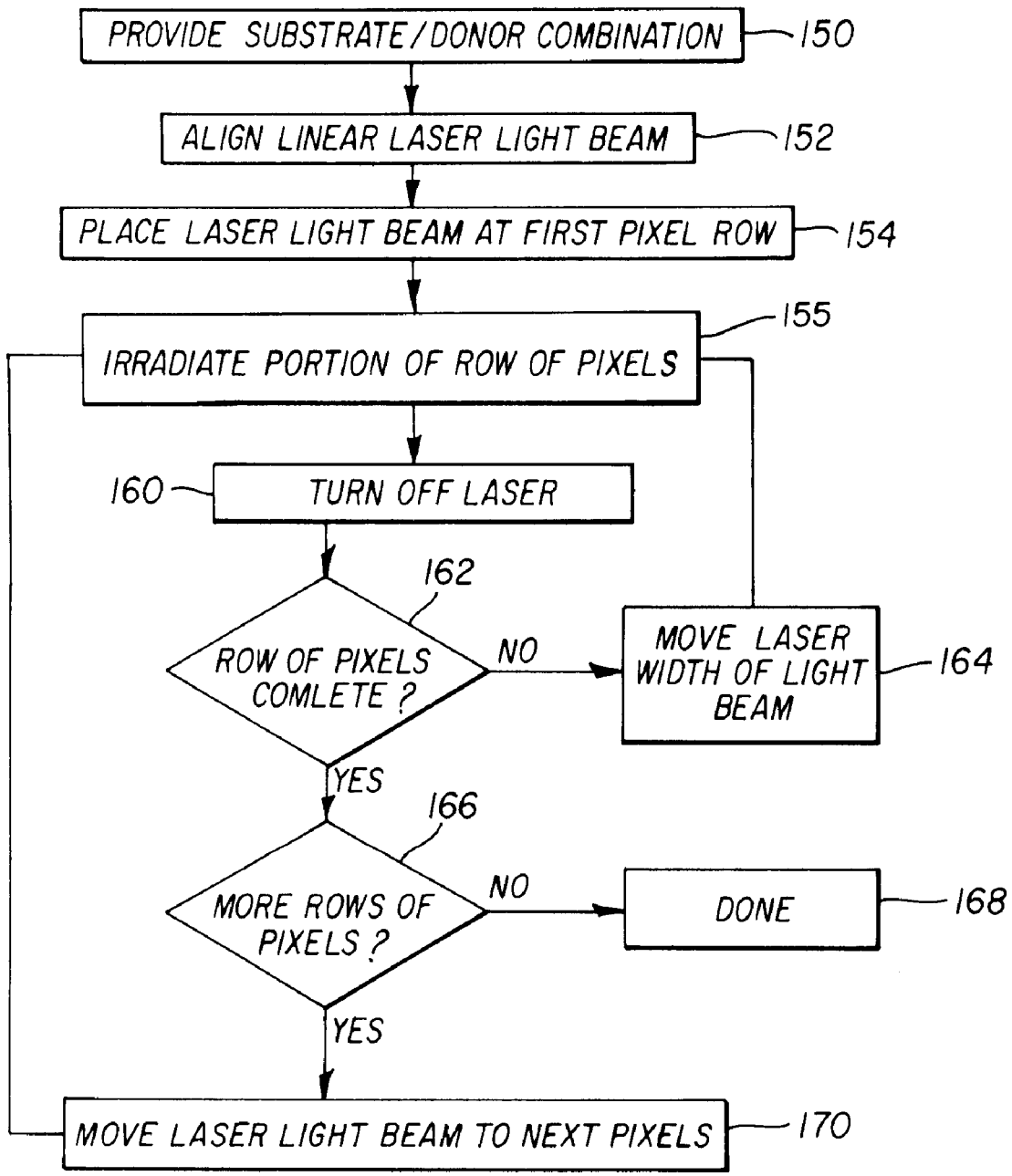
FIG. 7 is a block diagram showing another embodiment of a method of transferring organic material to an OLED substrate in accordance with this invention.

Turning now to FIG. 7, and referring also to FIG. 6, there is shown another embodiment of the steps of a method of transferring organic material from a donor element to a substrate in accordance with this invention. Initially, a secured substrate/donor element combination is provided (Step 150). Linear laser light beam 36 is then aligned with pixels 40 on the substrate (Step 152). Linear laser light beam 36 is placed on a first portion of first plurality of pixels 44 (Step 154), and then turned on to irradiate the first portion of first plurality of pixels 44 for a period of time greater than 1 millisecond (Step 155) to cause the transfer of organic material from the donor element to the substrate. After linear laser light beam 36 transfers organic material to the first portion of first plurality of pixels 44, linear laser light beam 36 is turned off (Step 160). If transfer of organic material to the first plurality of pixels 44 is not complete (Step 162), linear laser light beam 36 is moved (Step 164) to a new portion of first plurality of pixels 44, and is turned on to cause the transfer of organic material to the substrate. In moving linear laser light beam 36 to a new portion of first plurality of pixels 44, the distance moved can be the width of linear laser light beam 36 (that is, the distance of full width at half maximum 28). However, the amount of material transferred can be wider or narrower than linear laser light beam 36, depending on power and length of irradiation. In this case, it will be necessary to adjust the distance that linear laser light beam 36 is moved. Steps 155 to 164 are repeated as necessary to transfer organic material to the entirety of first plurality of pixels 44. If the transfer of organic material to first plurality of pixels 44 is complete (Step 162) and if further rows of pixels are to be treated (Step 166), linear laser light beam 36 is moved (Step 170) to a first portion of the next row of pixels to be irradiated (e.g. second plurality of pixels 46), and steps 155 to 164 are repeated. If there are no more pixels of the specific color to be treated (Step 166), the process ends (Step 168).

In an alternate embodiment, linear laser light beam 36 can be turned on to irradiate and transfer material to the first portion of first plurality of pixels 44 and scanned across first plurality of pixels 44 to completely transfer organic material to the entirety of first portion of pixels 44. This process would thus include a series of scans wherein linear laser light beam 36 is scanned slowly across a plurality of pixels, separated by fast movement steps wherein linear laser light beam is moved quickly from one plurality of pixels to another.

Figure 8:
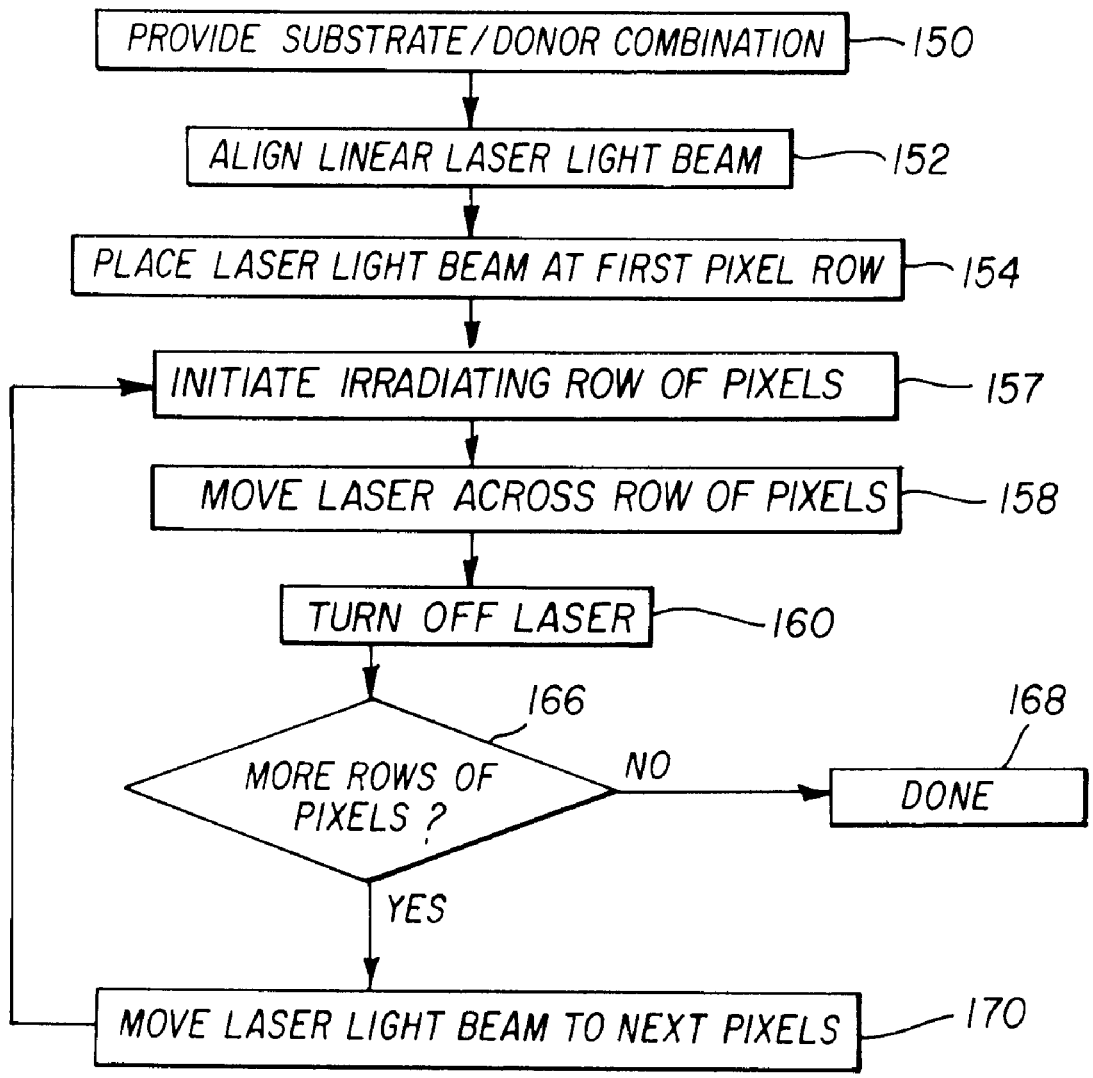
FIG. 8 is a block diagram showing another embodiment of a method of transferring organic material to an OLED substrate in accordance with this invention.

Turning now to FIG. 8, and referring also to FIG. 6, there is shown this embodiment of the steps of a method of transferring organic material from a donor element to a substrate in accordance with this invention. Initially, a secured substrate/donor element combination is provided (Step 150). Linear laser light beam 36 is then aligned with pixels 40 on the substrate (Step 152). Linear laser light beam 36 is placed on a first portion of first plurality of pixels 44 (step 154), and then turned on (Step 157) to cause the transfer of organic material from the donor element to the substrate. Linear laser light beam 36 is scanned across the width of first plurality of pixels 44 (Step 158). After first plurality of pixels 44 is completely irradiated, linear laser light beam 36 is turned off (Step 160). If further rows of pixels are to be treated (Step 166), linear laser light beam 36 is moved (Step 170) to the first portion of the next row of pixels to be irradiated (e.g. second plurality of pixels 46), and Steps 157 to 160 are repeated. If there are no more pixels of the specific color to be treated (Step 166), the process ends (Step 168).

Figure 9:
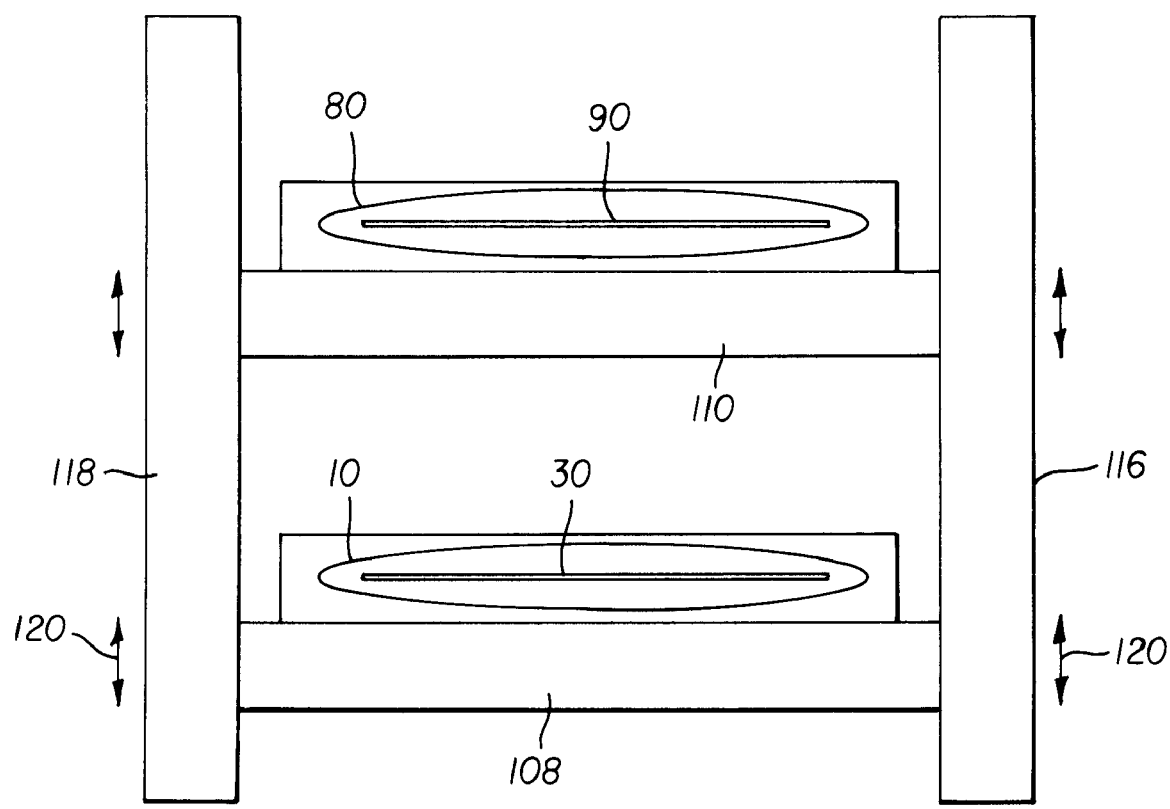
FIG. 9 is a cross-sectional diagram showing another embodiment of an apparatus of multiple laser sources in accordance with this invention.

FIG. 9 is a cross-sectional diagram showing another embodiment of an apparatus of multiple linear laser light beams and micropositioning devices in accordance with this invention. In addition to the components already described above in FIG. 2, this apparatus includes at least one additional carriage 110 with laser radiation source 80 capable of generating linear laser light beam 90. The advantage of two or more linear laser light beams is that organic material can be simultaneously transferred from a donor element to two or more rows of pixels on a substrate.

The invention and its advantages can be better appreciated by the following comparative examples.

Donor Element

A donor element for use in both the comparative and the inventive examples of OLED devices was constructed in the following manner:

1. An antireflection layer of 40 nm of silicon, an absorption layer of 40 nm of chromium, and a layer of 15 nm of aluminum were vacuum-deposited in that order onto a 51 micron polyimide donor substrate.
2. A mixed donor layer was formed over the aluminum by co-evaporating 20 nm of 2-tert-butyl-9,10-bis(2-naphthyl)anthracene (TBADN) and 0.25 nm of tetra-tert-butyl-perylene (TBP) under vacuum from separate evaporating boats.

OLED DEVICE EXAMPLE 1 (COMPARATIVE EXAMPLE)

An OLED device with inventive and comparative areas was constructed in the following manner:

1. Onto a clean glass OLED substrate, a pattern of 40 to 80 nm transparent electrodes was created by a standard photolithography process.

2. The resulting surface was treated with a plasma oxygen etch, followed by plasma deposition of ~0.1 nm of $CF_x$.
3. A 150 nm hole-transporting layer of 4,4'-bis[N-(1-naphthyl)-N-phenylamino]biphenyl (NPB) was vacuum deposited onto the surface.
4. The donor element prepared in Donor Element Example 1 was placed on top of the NPB layer and held in proximal contact using pressure as described by Phillips in U.S. Patent Application Publication 2003/014870. A small gap of approximately one micron was maintained by the texture of the donor substrate. In regions of the OLED substrate in which emission is desired, transfer of the emissive material from the donor element was effected by irradiation through the polyimide substrate with an infrared linear laser light beam. The linear laser light beam has a full width at half maximum of 8.5 microns, and 2.56 mm length, and a power of 10 watts. The beam was scanned in a direction perpendicular to the long dimension of the beam at a velocity of 650 mm/sec. The dwell time for donor deposition was approximately 13 microseconds with an energy density of 0.3 $J/cm^2$.
5. A 30 nm electron-transporting layer of tris(8-hydroxyquinoline)aluminum (ALQ) was vacuum deposited onto the emissive layer.
6. A 0.5 nm electron-injecting layer of LiF was vacuum-deposited onto the electron-transporting layer.
7. An electrode was formed over the electron-injecting layer by depositing 100 nm aluminum by vacuum deposition.

OLED DEVICE EXAMPLE 2 (INVENTIVE EXAMPLE)

An OLED device satisfying the requirements of this invention was constructed as Example 1, except that the power of the beam was reduced to 2.0 watts and the irradiation of an area the dimensions of the laser beam was performed by holding the beam motionless during an irradiation with a dwell time of 1 millisecond. This gave an energy density of 4.6 $J/cm^2$. After this irradiation, the beam was moved 16 microns in the direction perpendicular to the long dimension of the laser beam, and the irradiation was repeated multiple times to cover the device.

OLED DEVICE EXAMPLES 3-7 (INVENTIVE EXAMPLES)

An OLED device satisfying the requirements of this invention was constructed as in Example 2, except that the power of the beam was reduced to 0.12 watts and the dwell time was varied from 180 to 300 milliseconds as in the table below. The resulting exposure is also given in the table.

The lifetime was measured by putting a constant current of 80 $mA/cm^2$ through the constructed OLED devices and monitoring the intensity of the light output with time. The blue dopant emission was detected by observing the emission spectra for the characteristic 3-peaked emission from TBP, with the strongest peak located at about 460 nm. The results are shown in Table 1.

TABLE 1

| Example # | Example Type | Dwell time (milliseconds) | Exposure ($J/cm^2$) | Relative Life Time to 50% Luminance |
|---|---|---|---|---|
| 1 | Comparative | 0.013 | 0.3 | 1.0 |
| 2 | Inventive | 1.0 | 4.6 | 2.0 |
| 3 | Inventive | 180 | 49.0 | 10.1 |
| 4 | Inventive | 200 | 54.5 | 10.7 |
| 5 | Inventive | 260 | 70.8 | 9.2 |
| 6 | Inventive | 280 | 76.2 | 4.1 |
| 7 | Inventive | 300 | 81.7 | 4.5 |

The results demonstrate that the method of this invention produces OLED devices with a longer lifetime, where lifetime is defined as the time for the luminance to decrease to 50% of the initial value. Longer dwell times at the same power result in higher exposure. With higher exposure, the lifetime is reduced relative to the maximum lifetime at about 200 milliseconds, but the lifetime under these conditions is still better than the comparative example.

The invention has been described in detail with particular reference to certain preferred embodiments thereof, but it will be understood that variations and modifications can be effected within the spirit and scope of the invention.

PARTS LIST 10 laser radiation source
12 beam shaper
14 laser beam
20 illumination optics
26 full width at half maximum
28 full width at half maximum
30 linear laser light beam
32 first direction
33 light intensity profile
34 second direction
36 linear laser light beam
38 light intensity profile
40 pixel
44 first plurality of pixels
46 second plurality of pixels
50 donor element
64 substrate
66 pressurizing means
80 laser radiation source
90 linear laser light beam
108 carriage
110 carriage
116 micropositioning device
118 micropositioning device
120 direction
150 block
152 block
154 block
155 block
156 block
157 block
158 block
160 block
162 decision block
164 block
166 decision block
168 block
170 block

The invention claimed is:

1. A method of transferring organic material from a donor element across a gap to a substrate of an organic light emitting display (OLED) device, the donor element being capable of converting laser light to heat, comprising:
   (a) providing a source of laser radiation; and
   (b) providing the gap between the donor element and the substrate and selecting the power of the laser radiation applied to the donor element by the laser radiation source to cause sufficient heat to transfer the organic material across the gap to the substrate to form a light-emitting, layer wherein the time that each position of the donor element that receives laser radiation to cause the transfer of organic material is greater than 1 millisecond.

2. The method of claim 1 wherein the transfer of organic material is under reduced pressure or at atmospheric pressure.

3. The method of claim 1 further including securing the donor element relative to the substrate.

4. The method of claim 1 wherein the power of the laser radiation applied to the donor element is selected so that the energy density is greater than 4.6 J/cm$^2$.

5. The method of claim 1 further including:
   (c) causing the laser radiation source to form a laser beam that extends across all or a first portion of a first plurality of pixels on the substrate;
   (d) illuminating the donor element with the laser beam to cause the transfer of organic material to the first plurality of pixels or the first portion of the plurality of pixels of the substrate; and
   (e) wherein the laser beam has a uniform intensity profile in a first direction and a Gaussian-like intensity profile in a second direction perpendicular to the first direction.

6. The method of claim 5, wherein after the laser beam transfers organic material to all of the first plurality of pixels, the laser beam is turned off, moved to a new position over a second plurality of pixels, and is turned on to cause the transfer of organic material to the substrate.

7. The method of claim 5, wherein after the laser beam transfers organic material to the first portion of the first plurality of pixels, the laser beam is turned off, moved to a new portion of the first plurality of pixels, and is turned on to cause the transfer of organic material to the substrate.

8. The method of claim 5, wherein after the laser beam transfers organic material to the first portion of the first plurality of pixels, such the laser beam is scanned across the first plurality of pixels to cause the transfer of organic material to the substrate.

9. The method of claim 5 wherein the transfer of organic material is under reduced pressure or at atmospheric pressure.

10. The method of claim 5 further including securing the donor element relative to the substrate.

* * * * *